United States Patent
Van De Beek et al.

(10) Patent No.: US 7,274,753 B2
(45) Date of Patent: Sep. 25, 2007

(54) METHOD OF IMPLEMENTING MODULATION AND MODULATOR

(75) Inventors: Jaap Van De Beek, Sundbyberg (SE); Oskar Mauritz, Stockholm (SE)

(73) Assignee: Nokia Corporation, Espoo (FI)

( * ) Notice: Subject to any disclaimer, the term of this patent is extended or adjusted under 35 U.S.C. 154(b) by 744 days.

(21) Appl. No.: 10/626,840

(22) Filed: Jul. 25, 2003

(65) Prior Publication Data
US 2005/0025256 A1    Feb. 3, 2005

Related U.S. Application Data

(63) Continuation of application No. PCT/FI01/00073, filed on Jan. 26, 2001.

(51) Int. Cl.
*H04L 27/20* (2006.01)
*H04L 27/36* (2006.01)

(52) U.S. Cl. .................. 375/308; 375/298; 332/103

(58) Field of Classification Search ............... 375/261, 375/279–281, 298, 308; 332/103, 144
See application file for complete search history.

(56) References Cited

U.S. PATENT DOCUMENTS

| 4,613,976 | A | * | 9/1986 | Sewerinson et al. | ........ 375/279 |
|---|---|---|---|---|---|
| 5,124,979 | A | | 6/1992 | Matui | |
| 5,627,499 | A | * | 5/1997 | Gardner | ................ 332/101 |
| 6,320,914 | B1 | * | 11/2001 | Dent | ...................... 375/302 |
| 6,421,379 | B1 | * | 7/2002 | Vannatta et al. | ............ 375/229 |
| 7,046,738 | B1 | * | 5/2006 | Dent | ...................... 375/296 |
| 2002/0191713 | A1 | * | 12/2002 | McVey | ...................... 375/308 |

FOREIGN PATENT DOCUMENTS

| EP | 0 725 487 A2 | 8/1996 |
|---|---|---|
| EP | 0 920 164 A2 | 6/1999 |

* cited by examiner

*Primary Examiner*—Young T. Tse
(74) *Attorney, Agent, or Firm*—Squire Sanders & Dempsey L.L.P.

(57) ABSTRACT

A transmitter in which modulator output signal values are generated by a multi-level modulation method. The transmitter comprises a look-up table for storing a pre-defined number of values corresponding to data symbols and representing a signal or a pulse format, registers for selecting values representing the signal or the pulse format to be used to defined in-phase and quadrature component values, and adders for defining the modulator output signal values by summing the in-phase and quadrature component values while the number of the in-phase and quadrature component values to be summed is determined by a number of interdependent symbols.

23 Claims, 3 Drawing Sheets

METHOD OF IMPLEMENTING MODULATION AND MODULATOR

This application is a continuation of international application PCT/FI01/00073 filed Jan. 26, 2001 which designated the US and was published under PCT article 21(2) in English.

BACKGROUND OF THE INVENTION

1. Field of the Invention

The invention relates to a method of generating modulator output signal values when employing a multi-level modulation method, i.e. a modulation method whose signal space diagram has several points depicting a state or level.

2. Description of the Related Art

In digital communications, for instance radio telecommunications systems or optical fibers, the signal being transmitted is typically a carrier signal modulated with information bits. Modulation makes it possible to transfer several signals in one and the same channel on different frequencies. Modulation can be both digital and analogue. Digital modulation methods can be divided into three basic methods which can also be combined: ASK or amplitude shift keying, PSK or phase shift keying, and FSK or frequency shift keying. The amplitude of the carrier is altered in amplitude shift keying, the phase of the carrier is altered in phase shift keying and the frequency of the carrier is altered in frequency shift keying, according to the information bits. In most cases, present radio telecommunications systems use different phase shift keying methods, which include MSK or minimum shift keying, QPSK or quadrature phase shift keying, and OQPSK or offset quadrature phase shift keying.

The modulated signal is often depicted using a signal space diagram. FIG. 1 shows an example of a two-dimensional signal space diagram of a phase-modulated signal, when the modulation has four levels. The system then uses four different signals or pulse formats. In the example of FIG. 1, points 100, 102, 104, 106 depict different signals, i.e. states of the signal space diagram. In the signal space diagram, the pointer diagrams of the signals have been combined in one figure. FIG. 1 shows a pointer diagram arrow 108 which depicts the amplitude of one signal, and an angle 110 which depicts the phase. For the signal, the pointer diagram shown is $A \cos(2\pi f_0 t + \phi)$, where A is the signal amplitude, $f_0$ medium frequency, t time, and $\phi$ phase. In the different states 100, 102, 104, 106 of the signal space diagram, the signal obtains a different phase. The number of states in a signal space diagram varies depending on the modulation method; the more states, the higher the data transmission capability the system has. A signal space diagram can be shown as a unit circle as in FIG. 1, but other presentation methods exist. The example of FIG. 1 is a signal space diagram of quadrature signals, in which the axes are Q representing a quadrature component and I representing an in-phase component.

Today, a need has arisen to increase the data transmission capacity of radio telecommunications systems, such as cellular radio systems, to make a wireless use of the Internet or video telephone calls possible. One solution to this problem is using multiple-level modulation. In the EDGE (enhanced data rates for GSM evolution) system, for instance, the data transmission capacity of the GSM (Global System for Mobile Communications) system is improved by shifting from the MSK modulation to 8-PSK, i.e. an eight-level, phase modulation. There is, however, the problem of implementing a multi-level modulation sufficiently quickly and efficiently.

SUMMARY OF THE INVENTION

It is an object of the invention to provide an improved method of implementing multi-level modulation. This is achieved by a method of generating modulator output signal values when employing a multi-level modulation method. In the method, a pre-defined number of values corresponding to data symbols and representing a signal or a pulse format are stored, values representing a signal or a pulse format to be used to define in-phase and quadrature component values are selected, in-phase and quadrature component values using the selected values representing a signal or a pulse format are defined, modulator output signal values are defined by summing in-phase and quadrature component values while the number of in-phase and quadrature component values to be summed is determined by the number of inter-dependent symbols.

The invention also relates to a transmitter implementing the method, in which modulator output signal values are generated by a multi-level modulation method. The transmitter comprises means for storing a pre-defined number of values corresponding to data symbols and representing a signal or a pulse format, the transmitter comprises means for selecting values representing a signal or a pulse format to be used to define in-phase and quadrature component values, the transmitter comprises means for defining in-phase and quadrature component values using the selected values representing a signal or a pulse format, the transmitter comprises means for defining modulator output signal values by summing in-phase and quadrature component values while the number of in-phase and quadrature component values to be summed is determined by the number of inter-dependent symbols.

Preferred embodiments of the invention are set forth in the dependent claims.

The invention is based on the idea that by means of values corresponding to data symbols and representing a signal or a pulse format, such as signal samples, stored in memory in advance, typically baseband modulator output values are formed. The values corresponding to data symbols and representing a signal or a pulse format are preferably stored in look-up tables.

The method and system of the invention provide several advantages. With the method of the invention, it is possible to implement different multi-level modulation methods quickly and efficiently without multiplication requiring a high computational capacity. Similarly, other signal processing action, such as pulse-shaping and offset-rotation, can be taken without truncation loss caused by computational accuracy. The system of the invention provides a possibility to save in power consumption. Additionally, if the signal space diagram is symmetric like in the EDGE system, it is possible to reduce the amount of stored values corresponding to data symbols and representing a signal or a pulse format.

BRIEF DESCRIPTION OF THE FIGURES

In the following, the invention will be described by means of preferred embodiments and with reference to the appended drawings in which.

DETAILED DESCRIPTION OF THE PREFERRED EMBODIMENTS

The present invention can be used in different digital communications systems, like optical wires or copper wires. It can also be used in several wireless communications systems, such as satellite communication or cellular radio systems. The used multiple access method does not matter. For instance, CDMA (code division multiple access), WCDMA (wideband code division multiple access) and TDMA (time division multiple access) or their hybrids are possible. It is also obvious to a person skilled in the art that the method of the invention can also be applied to systems employing different modulation methods or air interface standards. The method of the invention can be applied to systems employing multi-level modulation methods, in particular, such as the GSM (Global System for Mobile Communications) system modification, the EDGE (enhanced data rates for GSM evolution) system, which employs 8-PSK modulation.

Figure 1:
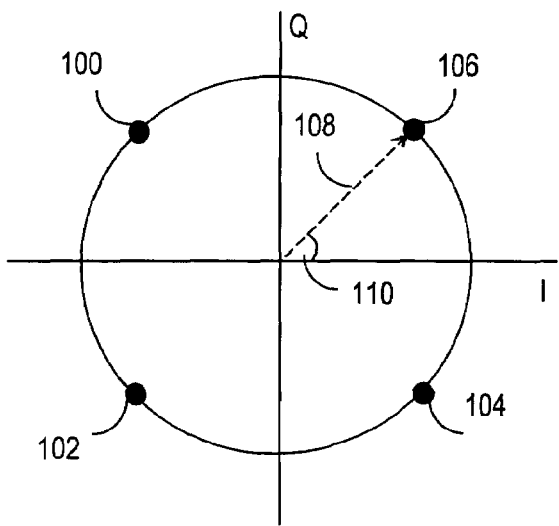
FIG. 1 shows an example of a two-dimensional signal space diagram.
Figure 2:
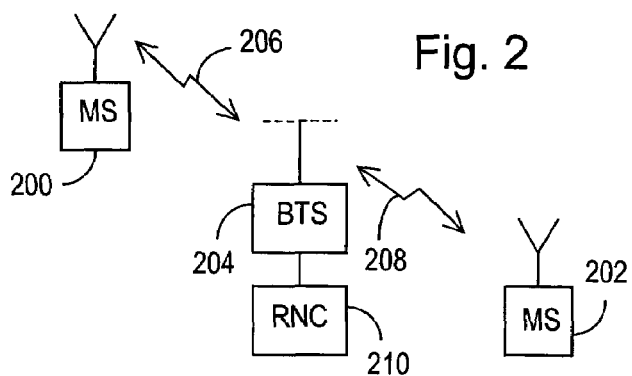
FIG. 2 illustrates an example of a telecommunications system.

FIG. 2 illustrates in a simplified manner one digital data transmission system to which the solution of the invention can be applied. This is a part of a cellular radio system, which comprises a base station 204 in radio contact 206 and 208 with subscriber terminals 200 and 202 which can be fixed, in a vehicle or portable terminals. The base station has transceivers, for instance. The transceivers of the base station are connected to an antenna unit which establishes a radio connection to the subscriber terminal. The base station is further connected to a base station controller 210 which switches the terminal connections to other parts of the network. The base station controller controls in a centralised manner several base stations connected to it. A control unit in the base station controller takes care of call control, mobility management, collecting statistics, and signalling.

The cellular radio system can also be in contact with a public telephone network.

In modulation, the properties of a sine-format carrier, such as amplitude, frequency or phase, or a combination thereof, are typically altered with the information being transmitted. In modulation, it is also possible to alter other properties of a carrier signal, such as its polarisation. In digital modulation, information is typically binary words which consist of symbols which comprise one or more bits. The following describes multi-level phase modulation, i.e. M-PSK, in particular, in which the information being transmitted is transferred in the changes of the carrier phase. An M-PSK-modulated carrier can thus be presented as $$u(t) = \sum_k A\cos(2\pi f_c t + \phi_k) \, p(t - kT), \quad (1)$$

or

-continued $$u(t) = \sum_k \left[ I_k \cos(2\pi f_c t) - Q_k \sin(2\pi f_c t) \right] p(t - kT), \text{ where} \quad (2)$$

A=constant-value amplitude,
$\phi_k$=phase of the modulated carrier signal,
$I_k$=A $\cos(\phi_k)$,
$Q_k$=A $\sin(\phi_k)$,
$f_c$=carrier frequency.

The $I_k$ component is typically referred to as an in-phase component and the $Q_k$ component as a quadrature component, because the phase-modulated carrier u(t) can be deemed to be composed of a sum of two quadrature wave formats, $\cos(2\pi f_c t)$ and $\sin(2\pi f_c t)$. These wave formats obtain their value according to the modulation method. The components $I_k$ and $Q_k$ can also be modulated independent of each other, because they are orthogonal in relation to each other.

The signal space diagram of multi-level phase modulation M-PSK comprises several points representing a state or level, for instance 8-PSK modulation has 8 levels. If the information symbols are binary, $8=2^3$ is obtained. Then each information symbol is indicated by three bits and the phase difference between different symbols, or states, obtains the value $\pi/4$. If the modulation method has four levels, each information symbol is indicated by two bits and the phase difference between symbols obtains the value $\pi/2$. How the symbols are formed, depends on the data and the selected coding.

In many modulation methods, all state transitions, even transitions over the origin of the signal space diagram, are possible. In practice, power amplifiers have a non-linear operating range on high and low power. Non-linearities of a low power range cause distortion in the signal. To stop signal distortion, one or more modulation signals can typically be delayed half a symbol time-slot. This way, state transitions over the origin of the signal space diagram can be eliminated. Transitions occur twice at symbol time after a change, in which case the modulation must be performed faster. There are also other ways to avoid transitions over the origin of the signal space diagram. In 8-PSK modulation, for instance, the undesired transitions can be avoided by rotating the symbols by an odd multiple of $\pi/8$. The change can be described by thinking that the signal space diagram has two 8-PSK signal space diagrams on top of each other with one rotated by $\theta_{offset}$, i.e. an odd multiple of $\pi/8$, and the transition from one signal space diagram to the other takes place at every consecutive symbol time-slot. This way, the offset 8-PSK modulation can be thought to be a 16-PSK modulation. Offset rotation also provides the advantage that the envelope of the modulated signal has a more constant value.

In applied systems, the spectrum of the signal to be transmitted must be restricted by filtering to maintain the bandwidth within a desired range. There are several different filter types, which include a triangular filter and a Gaussian filter. The impulse response of the triangular filter is triangular in shape. The triangular filter produces linear state transitions between symbols and its output depends on two consecutive symbols. The impulse response of the Gaussian filter resembles a Gaussian curve in shape. The output of the Gaussian filter in the EDGE system depends on five consecutive symbols. When using the Gaussian filter, state transitions are not linear.

Figure 3:
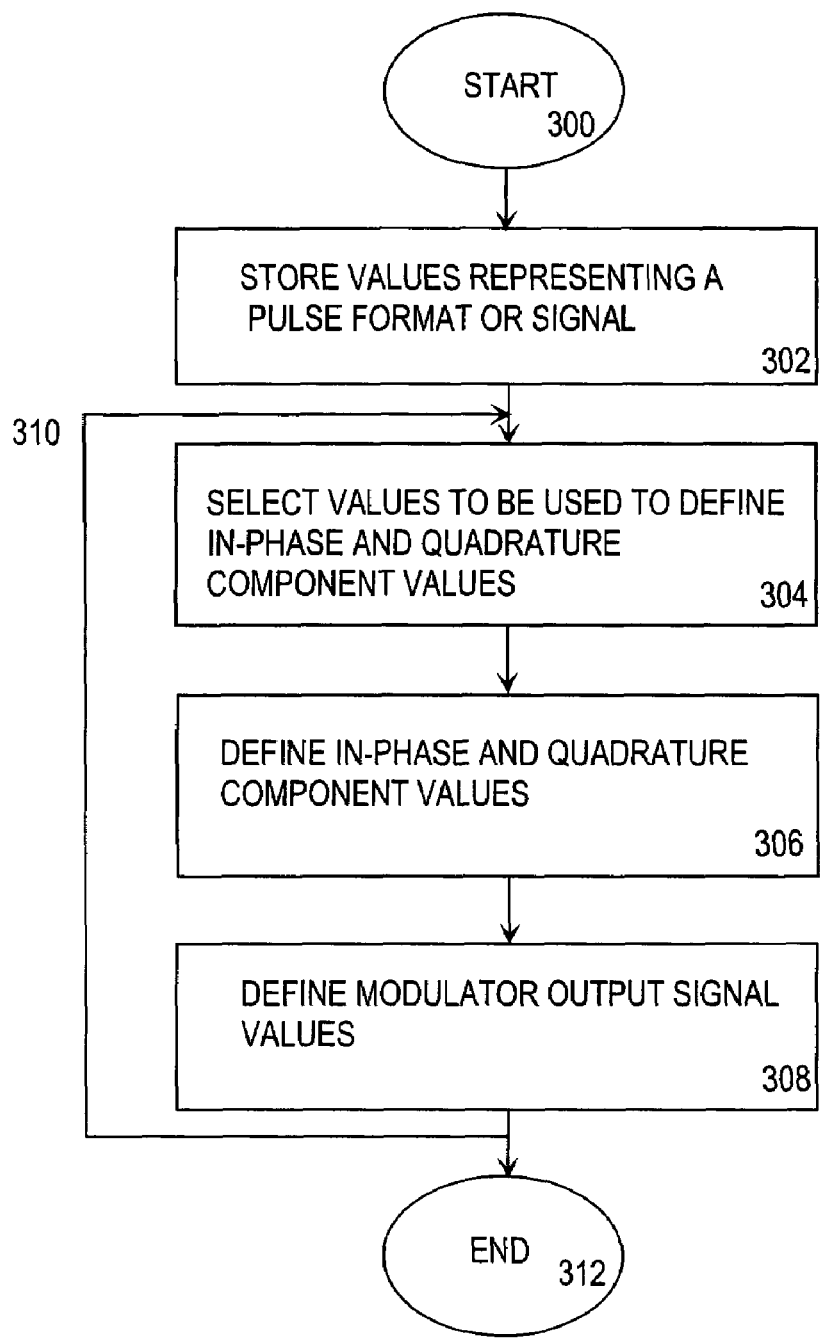
FIG. 3 shows a flow chart of method steps for generating modulator output signal values when employing a multi-level modulation method.

FIG. 3 shows a flow chart of method steps for generating typically baseband modulator output signal values when employing a multi-level modulation method. The execution of the method starts from block 300. In block 302, a pre-defined number of values corresponding to data symbols and representing a signal or a pulse format are stored. Typically, values corresponding to each data symbol and representing a signal or a pulse format are stored according to the modulation method. In practice, the values to be stored can be samples taken from a signal or a pulse format that can be scaled by a coefficient, if necessary. The values representing a signal or a pulse format are typically stored in one or more look-up tables. The values representing a signal or a pulse format can also be stored in a format which also comprises the offset-rotation of the signal, of which an example relating to 8-PSK modulation is described above. The values representing a signal or a pulse format are typically formed of one or two real-value signals, because the stored values are used to define modulated in-phase and quadrature values.

In block 304, values representing a signal or a pulse format used to define in-phase and quadrature values are, depending on the data symbol and modulation method, selected from the values corresponding to data symbols and representing a signal or a pulse format.

In block 306, in-phase and quadrature component values are defined using the selected values corresponding to data symbols and representing a signal or a pulse format. The definition of in-phase and quadrature component values also comprises the definition of the sign, + or −, when necessary.

In block 308, modulator output signal values are defined by summing in-phase and quadrature component values while the number of in-phase and quadrature component values to be summed is determined by the number of inter-dependent symbols. This way, the properties of the pulse formation filter of the system are taken into account; for instance, as mentioned earlier, if the telecommunications system is EDGE and the filter is a Gaussian filter, the output of the filter depends on five consecutive symbols, in which case one modulator output signal value is obtained by summing the I and Q components or the I and Q component pairs of four earlier data symbol values with the I and Q components or I and Q component pairs of the symbol to be modulated. It should be noted that the in-phase and quadrature components can be modulated separately and combined into one signal after the modulation, or they can be modulated together as I and Q component pairs.

Arrow 310 represents the repeatability of the method in that the calculation is repeated for each data symbol to be modulated. The execution of the method ends in block 312.

Figure 4:
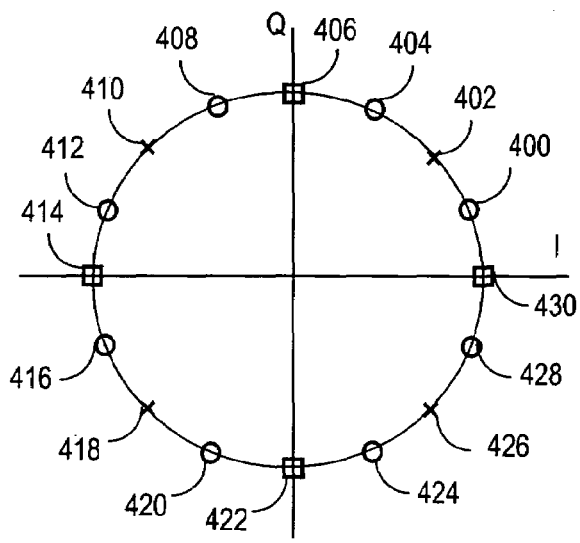
FIG. 4 illustrates an example of a 16-PSK signal space diagram.

Next, the method of FIG. 3 is described in connection with offset 8-PSK modulation used in the EDGE system by means of the 16-PSK signal space diagram example illustrated in FIG. 4. In the figure, the quadrature values are on the vertical axis and the in-phase component values are on the horizontal axis. An offset 8-PSK-modulated signal of the EDGE system and filtered with a Gaussian filter can be presented as $$y(t) = \sum_{k=m-4}^{m} \beta_k \cdot c_0(t - (k+4)T), \quad (3)$$

$$t \in [(m+1, 5)T \to (m+2, 5)T], \text{ where}$$

$c_0(t)$ is preferably real-value signal and $$\beta_k = e^{j2\pi s_k/8} e^{j3\pi k/8} = e^{j2\pi(2s_k+3k)/16}, \text{ where} \quad (4)$$

$\beta_k$=complex symbol of a 16-PSK signal space diagram,
$s_k$=data symbol, i.e. modulator input,
$3\pi/8$=used offset-rotation angle,
$T$=symbol time.

If all possible I and Q wave formats were stored, there would be 32 values to store, because there are 16 signal states. The number of I and Q values to be stored can, however, be reduced by utilising the symmetry of the 16-PSK signal space diagram as described in the following. FIG. 4 shows that there are three different types of signal states: the I and Q wave formats corresponding to the four states 406, 414, 422, 430 marked with a square are either zero or obtain only one real value, $c_o(t)$; only one real-value wave format, $\cos(\pi/4)c_o(t)$, is stored of the I and Q wave formats corresponding to the four states 402, 410, 418, 426 marked with a cross; and to store the I and Q values corresponding to the eight states 400, 404, 408, 412, 416, 420, 424, 428 marked with a circle, it is necessary to store two real-value wave formats, $\cos(\pi/8)c_o(t)$ and $\sin(\pi/8)c_o(t)$.

The I and Q values are, as shown in the example, taken to a D/A converter to be converted from digital to analogue format. Let us assume that the converter frequency is 26 MHz, i.e. 96 times the symbol rate of the GSM system. This means that 96 samples shall be generated for each symbol. This produces digital I(t) and Q(t) signals $$I(t = iT + kT/96) = \text{real}\left\{y\left(\frac{kT}{96} + iT\right)\right\}, \quad k = -48, \ldots 47 \quad (5)$$

$$Q(t = iT + kT/96) = \text{imag}\left\{y\left(\frac{kT}{96} + iT\right)\right\} \quad i = 0, \ldots 151$$

Wave formats to be stored are $$C_1(k) = c_0\left(\frac{kT}{96}\right) \quad (6)$$

$$C_2(k) = \cos\left(\frac{\pi}{4}\right)c_0\left(\frac{kT}{96}\right) \quad k = -48, \ldots 47$$

$$C_3(k) = \cos\left(\frac{\pi}{8}\right)c_0\left(\frac{kT}{96}\right)$$

$$C_4(k) = \sin\left(\frac{\pi}{8}\right)c_0\left(\frac{kT}{96}\right)$$

where k is the index of the sample.

In addition, on the basis of symmetry $c_0(t)=c_0(-t)$, only the first half of the four wave formats needs to be stored and the remaining wave formats are obtained by setting the addresses of the look-up table in reverse order.

For each 8-PSK-modulated symbol, a corresponding 16-PSK symbol is calculated and then used to decide which one of the four stored wave formats $C_1$, $C_2$, $C_3$, or $C_4$ of the formula (6) are required to generate the I and Q values and what is the sign of this wave format. Next, the sum expression of the formula (3) is calculated using the stored I and Q values of the four earlier symbols.

Figure 5:
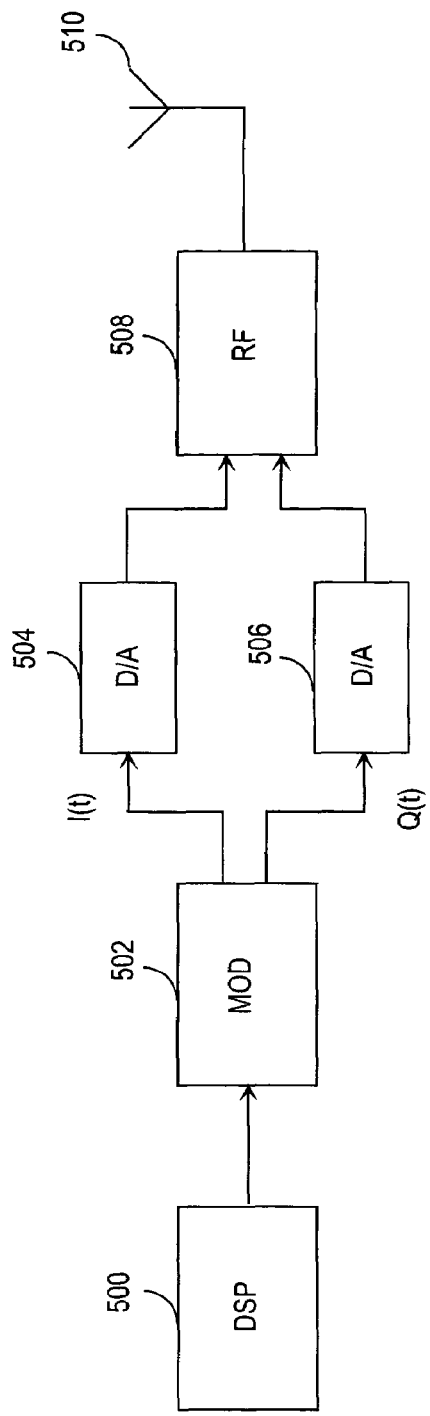
FIG. 5 shows an example of a transmitter structure.
Figure 6:
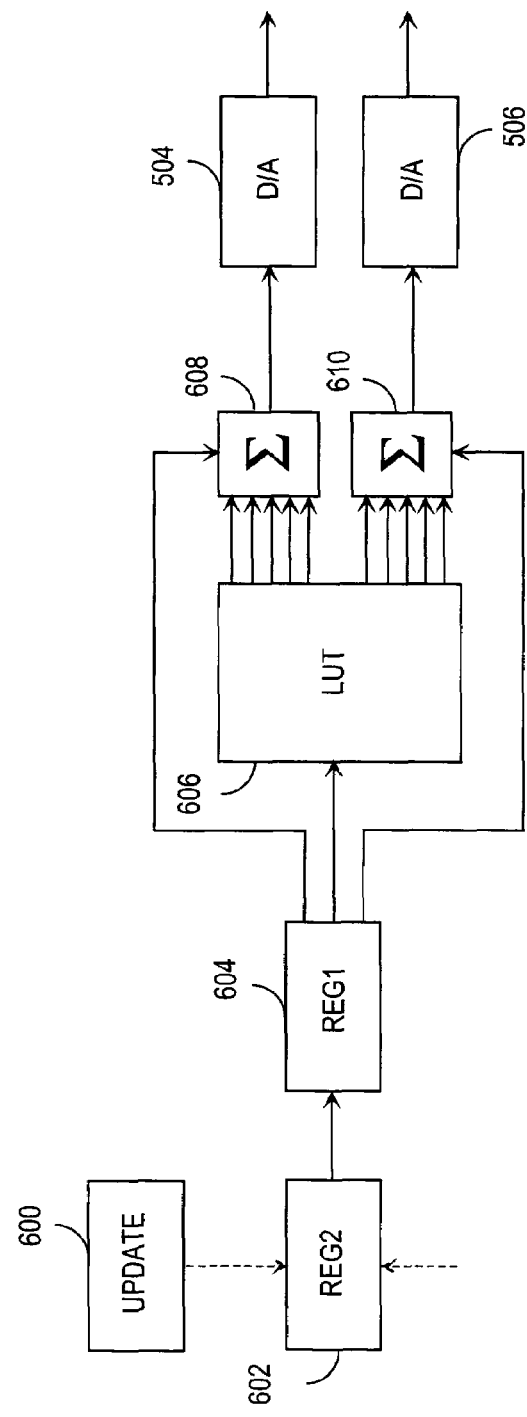
FIG. 6 shows an example of a modulator.

FIG. 5 shows one example of a part of a transmitter, which has a modulator of the type described above. The transmitter can be in any apparatus transmitting a digitally modulated signal, such as a mobile phone, palmtop computer or base station. In the example of FIG. 5, the in-phase and quadrature components (I and Q components) are modulated separately, but they can also be modulated together.

The input of the modulator 502 is a stream of data symbols from DSP (digital signal processing) means 500. In digital signal processing, channel correction action, for instance, is typically performed to compensate for the interference caused by the radio channel to the signal, utilising information received on the channel by means of a known training sequence.

Both channel and speech coding is also often performed in digital signal processing. A systematic bit redundance, typically parity bits, added to the signal in channel coding are used for error detection and correction in a decoder. In speech coding, generally source coding, the unsystematic redundance in the source symbols is typically eliminated to reduce the required bit rate.

In addition, in spread-spectrum systems, such as WCDMA (wideband code division multiple access), the spectrum of the signal is by means of a pseudo-random spreading code spread in a transmitter to wideband and despread in a receiver, thus endeavouring to increase the capacity of a channel. Coding can also be used to encrypt the transmission or the information in it. In addition, apparatuses of the GSM system typically include burst formation means which add tail bits of the burst and a training sequence to the data coming from a channel codec. The DSP means typically also adapt the signal to be transmitted and the signalling information to the air interface standard of the used cellular radio system.

The output of the modulator 502 is in-phase and quadrature components which are taken to digital/analogue converters 504, 506. After the converters 504, 506, the analogue and baseband signals are taken to radio frequency parts 508 in which the in-phase and quadrature components are combined using a prior art method, an adder, for instance. The combined signal is up-mixed to a selected transmission frequency, amplified and taken to an antenna 510.

In the following, a modulator is described in greater detail, in which modulator the modulation can be performed using values representing a signal or a pulse format and stored in look-up tables. The modulator is one used in the EDGE system described above.

Four in-phase and quadrature component values or value pairs defined last as well as in-phase and quadrature component values or value pair representing the data symbol to be modulated are stored in a first register 604. The values to be stored are according to formula (3). In addition, a sign for the sum expression in formula (3) is defined.

The input of a second register 602 is an 8-PSK-modulated symbol, to which a corresponding 16-PSK symbol is indicated in the register. The second register 602 is shifted three register locations to the left by means of an update block 600 after each processed symbol. An offset-rotation, of $3\pi/8$ degrees in this case, is thus implemented according to formula (4). A value of the second register 602 is a pointer to a 16-PSK symbol stored in the look-up table 606. Wave formats shown in formulas (6) are stored in the look-up table 606.

Next, the in-phase values, five consecutive values in the example case, are summed in an adder 608, and the quadrature values, five consecutive values in the example case, are summed in an adder 610. Finally, the results of the summing are taken to the digital/analogue converters 504 and 506.

It should be noted that the values representing a signal or a pulse format and stored in the look-up table, as well as other details of the method and modulator, such as the number and size of the registers, vary according to the modulation method, pulse formation filter, signal space diagram rotation and D/A converter rate, etc.

The invention can be implemented by program, for instance, using hardware solutions providing the required functionality, for instance as ASIC (application-specific integrated circuit) or utilising separate logic components. The invention can also be implemented by hardware.

Even though the invention has been explained in the above with reference to an example in accordance with the accompanying drawings, it is obvious that the invention is not restricted to it but can be modified in many ways within the scope of the inventive idea disclosed in the attached claims.

We claim:

1. A method of generating modulator output signal values when employing a multi-level modulation method, the method comprising:

storing a pre-defined number of values corresponding to data symbols and representing a signal or a pulse format, selecting values representing the signal or the pulse format to be used to define in-phase and quadrature component values, defining the in-phase and quadrature component values using the selected values representing the signal or the pulse format, and defining the modulator output signal values by summing the in-phase and quadrature component values while the number of the in-phase and quadrature component values to be summed is determined by a number of inter-dependent symbols.

2. The method as claimed in claim 1, wherein the modulator output signal values being formed are base-band values.

3. The method as claimed in claim 1, wherein the values representing the signal or the pulse format are stored in a look-up table.

4. The method as claimed in claim 1, wherein the values representing the signal or the pulse format are stored in a format which also comprises an offset-rotation of the signal.

5. The method as claimed in claim 1, further comprising storing values corresponding to each data symbol and representing the signal or the pulse format.

6. The method as claimed in claim 1, wherein at least one of the values corresponding to the data symbols and representing the signal or the pulse format used to define the in-phase and quadrature component values is formed of one real-value signal.

7. The method as claimed in claim 1, wherein at least one of the values corresponding to the data symbols and representing the signal or the pulse format used to define the in-phase and quadrature component values is formed of two real-value signals.

8. The method as claimed in claim 1, wherein in 8-PSK modulation, a corresponding 16-PSK-modulated symbol is defined, and a decision is made on which one of the stored values representing the signal or the pulse format is used to form the modulator output signal values and the signs of the values representing the signal or the pulse format in the modulator output signal values summing expression.

9. The method as claimed in claim 1, wherein the number of inter-dependent symbols is determined on a basis of the properties of a system filter.

10. The method as claimed in claim 1, wherein the multi-level modulation method is multi-level phase shift keying.

11. The method as claimed in claim 1, wherein the values representing the signal or the pulse format are samples of a modulating signal.

12. A transmitter in which modulator output signal values are generated by a multi-level modulation method, the transmitter comprising:
- means for storing a pre-defined number of values corresponding to data symbols and representing a signal or a pulse format,
- means for selecting values representing the signal or the pulse format to be used to define in-phase and quadrature component values,
- means for defining the in-phase and quadrature component values using the selected values representing the signal or the pulse format, and
- means for defining the modulator output signal values by summing the in-phase and quadrature component values while the number of the in-phase and quadrature component values to be summed is determined by a number of inter-dependent symbols.

13. The transmitter as claimed in claim 12, wherein the modulator output signal values to be formed are base-band values.

14. The transmitter as claimed in claim 12, wherein the values representing the signal or the pulse format are stored in a look-up table.

15. The transmitter as claimed in claim 12, wherein the values representing the signal or a pulse format are stored in a format which also comprises an offset-rotation of the signal.

16. The transmitter as claimed in claim 12, further comprising means for storing values corresponding to each data symbol and representing the signal or the pulse format.

17. The transmitter as claimed in claim 12, wherein at least one value corresponding to the data symbols and representing the signal or the pulse format used to define the in-phase and quadrature component values is formed of one real-value signal.

18. The transmitter as claimed in claim 12, wherein at least one value corresponding to the data symbols and representing the signal or the pulse format used to define the in-phase and quadrature component values is formed of two real-value signals.

19. The transmitter as claimed in claim 12, wherein in 8-PSK modulation, a corresponding 16-PSK-modulated symbol is defined, and a decision is made on which one of the stored values representing the signal or the pulse format is used to form the modulator output signal values and the signs of the values representing the signal or the pulse format in an output signal value summing expression.

20. The transmitter as claimed in claim 12, wherein the number of inter-dependent symbols is determined on the basis of the properties of a system filter.

21. The transmitter as claimed in claim 12, wherein the multi-level modulation method is multi-level phase shift keying.

22. The transmitter as claimed in claim 12, wherein the values representing the signal or the pulse format are samples of a modulating signal.

23. A transmitter in which modulator output signal values are generated by a multi-level modulation method, the transmitter is configured to:
- store a pre-defined number of values corresponding to data symbols and representing a signal or a pulse format,
- select values representing the signal or the pulse format to be used to define in-phase and quadrature component values,
- define the in-phase and quadrature component values using the selected values representing the signal or the pulse format, and
- define the modulator output signal values by summing the in-phase and quadrature component values while the number of the in-phase and quadrature component values to be summed is determined by a number of inter-dependent symbols.

* * * * *